United States Patent [19]

Matsuoka et al.

[11] Patent Number: 4,874,497
[45] Date of Patent: Oct. 17, 1989

[54] THIN FILM FORMING APPARATUS

[75] Inventors: Morito Matsuoka, Hitachi; Ken'ichi Ono, Mito, both of Japan

[73] Assignee: Nippon Telegraph and Telephone Corporation, Tokyo, Japan

[21] Appl. No.: 210,511

[22] PCT Filed: Oct. 8, 1987

[86] PCT No.: PCT/JP87/00759

§ 371 Date: Jun. 8, 1988

§ 102(e) Date: Jun. 8, 1988

[87] PCT Pub. No.: WO88/02791

PCT Pub. Date: Apr. 21, 1988

[30] Foreign Application Priority Data

Oct. 11, 1986 [JP] Japan .................. 61-241740

[51] Int. Cl.⁴ .............................. C23C 14/34
[52] U.S. Cl. ................................... 204/298
[58] Field of Search .......... 204/298 ME, 298 MW

[56] References Cited

U.S. PATENT DOCUMENTS

| 4,401,054 | 8/1983 | Matsuo et al. | 118/723 |
| 4,492,620 | 1/1985 | Matsuo et al. | 204/192.12 |
| 4,610,770 | 9/1986 | Saito et al. | 204/192.1 |
| 4,721,553 | 1/1988 | Saito et al. | 204/192.12 |

FOREIGN PATENT DOCUMENTS

| 59-53680 | 3/1984 | Japan | 204/298 |
| 59-145564 | 11/1984 | Japan . | |
| 61-87869 | 3/1986 | Japan . | |
| 62-222064 | 9/1987 | Japan | 204/298 |
| 62-222075 | 9/1987 | Japan | 204/298 |
| 62-224686 | 10/1987 | Japan | 204/298 |

OTHER PUBLICATIONS

F. M. D'Heurle: *Metall. Trans.*, vol. 1, Mar. 1970, pp. 725–732.
W. W. Y. Lee and D. Oblas: *J. Appl. Phys.*, vol. 46, No. 4, 1975, pp. 1728–1732.
R. K. Waits; *J. Vac. Sci. Technol.*, vol. 15, No. 2, 1978, pp. 179–187.
Ono et al., *Jpn. J. Appl. Phys.*, vol. 23, No. 8, 1984, L534–L536.

*Primary Examiner*—Aaron Weisstuch
*Attorney, Agent, or Firm*—Spencer & Frank

[57] ABSTRACT

Plasma is generated by electron cyclotron resonance utilizing microwave energy and is confined within a plasma generation chamber by a mirror magnetic field, whereby high density plasma is obtained. Targets are disposed within the plasma generation chamber in the direction perpendicular to the magnetic flux and sputtered by the ions in the high density plasma, whereby a large amount of ions are sputtered and neutral particles produced. The ions and neutral particles are extracted in the direction perpendicular to the magnetic flux and deposited over the surface of a substrate so that it is possible to form a thin film at a high deposition rate without the bombardment of high-energy particles upon the substrate. Furthermore, the ions and neutral particles can be extracted through a slit-like opening formed through the cylindrical wall of the plasma generation chamber, so that a thin film is continuously formed on the surface of a tape-like substrate.

4 Claims, 5 Drawing Sheets

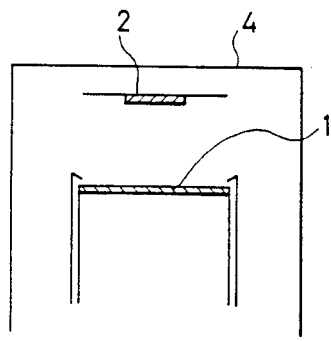
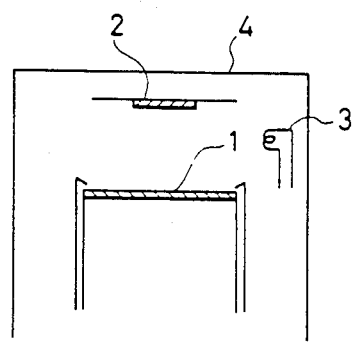
Fig-1 PRIOR ART
Fig-2 PRIOR ART
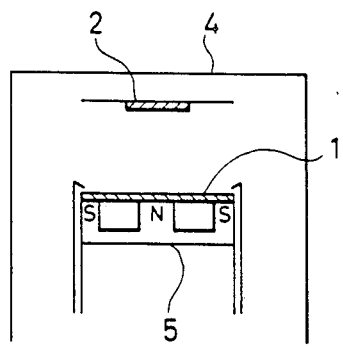
Fig-3 PRIOR ART

THIN FILM FORMING APPARATUS

TECHNICAL FIELD

The present invention relates to an apparatus for forming thin films of various materials on specimen substrates, and more particularly, a novel thin film forming apparatus utilizing sputtering by high density plasma, thereby forming various thin films at a high rate and a high degree of efficiency.

BACKGROUND ART

The so-called sputtering apparatus for forming a film by sputtering a target as a thin film forming element in plasma has been used widely in various fields of forming thin films of various materials. Especially (1) a conventional diode (rf or dc) sputtering apparatus (refer to F. M. D'HEURLE: *Metall. Trans.*, Vol 1, March, 1970, pp 725-732) in which a target 1 and a substrate 2 are disposed in opposing relationship in a vacuum chamber 4 as shown in FIG. 1; (2) a triode sputtering apparatus (refer to W. W. Y. Lee and D. Oblas: *J. Appl. Phys.*, Vol. 46, No. 4, 1975 pp 1728-1732) in which, as shown in FIG. 2, a third electrode 3 for emitting electrons is further disposed and (3) the magnetron sputtering process (refer to R. K. Waits: *J. Vac. Sci. Technol.*, Vol. 15, No. 2, 1978, pp 179-187) in which, as shown in FIG. 3, a suitable magnetic field is applied to a target 1 by a magnet 5 to generate high density and low-temperature plasma, thereby forming thin films at a high rate, are known in the technical field of thin film formation. Each of the above-mentioned equipment and process comprises generally a target 1 which is a thin film forming element, a substrate 2 upon which a thin film is formed, a vacuum chamber 4 in which the target 1 and the substrate 2 are enclosed and gas inlet and outlet systems, whereby plasma is generated in the vacuum chamber 4.

In case of forming a thin film at a high rate in each of the above-mentioned apparatus and process, it is essential that the density of plasma be maintained at a high level. In the case of the diode sputtering apparatus, the higher the density of plasma, the more drastically a voltage applied to the target is increased and concurrently the temperature of the substrate rapidly rises because of the bombardment of high energy particles an high-energy electrons in the plasma thereon. As a result, damage to the grown thin films is increased, so that the diode sputtering apparatus can be only used with special heat-resistive substrates, thin film materials and film compositions. In the case of the triode sputtering apparatus, even though the density of the plasma increases by the feeding of electrons from the third electrode, as in the case of the diode sputtering apparatus, the rapid temperature rise of the substrate results in damage to the thin film. As a consequence, the triode sputtering apparatus has the defect that only special film-forming materials may be used and the kinds of substrates to be used are also limited in number.

On the other hand, with the high-rate magnetron sputtering apparatus, the gamma ($\gamma-$) electrons which are emitted from the target and which are needed to ionize a gas in plasma are confined over the surface of the target by the magnetic and electric field, so that it becomes possible to generate high-rate plasma at a low gas pressure. For instance, the high-speed sputtering process can be carried out at a low pressure as low as $10^{-3}$ Torr in practice, so that the magnetron sputtering process has been used widely to form various thin films at high rates. However, in this process, the film being formed is subjected to the bombardment of ions (mainly $Ar^+$) from the plasma; high-energy neutral particles (mainly Ar reflected at the surface of the target); and negative ions. Accordingly in almost all the cases, the compositions of the films thus formed are deviated and not only the film but also the substrate are damaged. Furthermore, it is well known in the art that in the case of the formation of a ZnO film, the quality of the portion of the ZnO film immediately above the eroded or bombarded portion of the target is considerably different from the quality of the remaining portion. Thus, the magnetron sputtering process presents the problem of bombardment of highenergy particles over the surface of the substrate. In addition, since the eroded or bombarded portion of the target is locally distributed it has the defects that the efficiency of utilization is remarkably low and the productivity is not high in the case of industrialscale formation of thin films.

Furthermore, in the case of the formation of thin films by the conventional sputtering apparatus, the gas and the particles in plasma are not sufficiently ionized, so that neutral particles which are sputtered and deposited on the surface of the substrate are almost neutral when they impinge upon the surface of the substrate. From the standpoint of reaction, a sufficiently high degree of activation cannot be attained, and therefore in order to obtain an oxide film or films of thermally nonequilibrium materials, the temperature of the substrate must be raised to a temperature as high as 500°-800° C. In addition, almost all the electric power supplied to the plasma is consumed as thermal energy and the ratio of the electric power used to form plasma (ionization) to the total power applied to the apparatus is low, so that there is the defect that the power efficiency is low.

Furthermore, with the above-mentioned sputtering apparatus, stable discharge cannot be maintained at a gas pressure lower than $10^{-3}$ Torr and accordingly there arises a problem that impurities are trapped in a formed thin film.

Meanwhile, Matsuo et al. proposed a method for forming thin films (U.S. Pat. No. 4,401,054) by which plasma containing a material to be deposited is generated under electron cyclotron resonance conditions and the plasma thus generated is directed toward a specimen, thereby forming a thin film. However, by this method it is impossible to form a thin metal film or metal-compound film. Matsuo and Ono (U.S. Pat. No. 4,492,620) and Ono et al. (*Jpn. J. Appl. Phys.*, Vol. 23, No. 8, 1884, L534-L536) disclosed, a microwave plasma deposition apparatus in which a target is sputtered by microwave plasma generated by the electron cyclotron resonance (ECR) and the sputtered particles are deposited on the surface of a substrate, thereby forming a thin film.

The microwave plasma has excellent features in that the discharge can be produced at a pressure of from $10^{-5}$ to $10^{-4}$ Torr and the plasma is highly active. This apparatus is superior in that the highly activated plasma is generated at a low gas pressure by utilizing the above-mentioned features of the microwave plasma.

However, the target is disposed outside of the plasma generation chamber, so that the sputtering rate is not high enough and the ratio of ionization of the particles sputtered from the target is low and furthermore the energy control is not satisfactory.

Japanese Patent Application Laid-Open Nos. 61-87869 and 61-194174 disclose apparatus in which microwave plasma produced in ECR condition is confined by a mirror field so that the sputtering process can be carried out by the plasma whose density is considerably increased. In both cases, the sputtering process can be carried out at a high vacuum of the order of $10^{-4}$–$10^{-5}$ Torr. However, in the former apparatus, both the target and the substrate are disposed within high density plasma. Consequently, there arises the that high-energy neutral particles and charged particles directly bombard the surface of the substrate, so that the quality of the thin film being formed is degraded. Furthermore, there exists an adverse effect that the temperature of the substrate is raised by the high density plasma, so that a cooling mechanism for cooling the surface of the substrate becomes complex in construction. In the latter apparatus, plasma generated in a mirror field is extracted toward the surface of a target by another magnetic field generating means so as to sputter the target. In this case, the target is not disposed in the plasma generation chamber in which high density plasma is generated, so that the ratio of the ionization of the particles sputtered from the target is low. Therefore, the latter apparatus is not adapted to the formation of thin films by highly reactive ions.

In the case of the formation of thin films by the sputtering process, it is preferred that the following conditions are satisfied:

(1) The film and the substrate are not damaged, drastic rises in their temperatures must be prevented, and the films are formed at a high-rate (In other words, high density plasma must be generated);

(2) The energy of the particles can be controlled over a wide range;

(3) The dispersion of the energies of the particles must be minimized as practically as possible;

(4) The ionization ratio of plasma is high and the plasma is active; and (5) Plasma can be generated even at a low gas pressure.

In order to satisfy the above-described conditions, the same inventors disclosed in Japanese Patent Application No. 61-66866 a process in which a target is disposed substantially in parallel with the magnetic flux in front of high density plasma generated in a mirror field so that the sputtering process can be carried out at a high degree of efficiency and the ions generated are extracted in the direction of the magnetic field. In this process, the surface of the target is disposed substantially in parallel with the direction of the magnetic flux, so that the ions must be forced to traverse across the magnetic field and impinge on the target when they are extracted toward the target to sputter the same. Therefore, from the standpoint of a plasma generation efficiency, the process must be improved to exhibit a high efficiency. Furthermore, since the surface of the substrate upon which a thin film is formed is disposed perpendicular to the magnetic flux, there still remains a danger that the substrate is subjected to the bombardment of high-energy neutral particles.

DISCLOSURE OF THE INVENTION

The present invention was made to overcome the above and other problems and defects encountered in the conventional thin film forming apparatus.

An object of the present invention is, therefore, to provide a thin film forming apparatus in which high density plasma can be generated in a high vacuum; the ionization ratio of the plasma thus generated is high and the plasma is active; various ions such as metal ions and neutral particles can be produced; the damage and the drastic temperature rise of a film and a substrate is prevented so that the formation of a thin film can be carried out at a high rate; the energy of the particles can be controlled over a wide range; and the dispersion of the energy of the particles can be minimized as practically as possible.

In order to achieve this object, in the present invention, a thin film forming apparatus comprises:

a vacuum chamber consisting of a vacuum waveguide having a microwave introduction window at one end thereof, the microwave introduction window being connected to a microwave waveguide, a plasma generation chamber having a diameter and a length sufficient to define a microwave cavity resonator for causing resonance of the introduced microwave energy, and a specimen chamber all connected with each other in the order named, and further having a gas introduction inlet;

at least one pair of magnetic field generating means which are disposed around the outer side of both the end portions of the plasma generation chamber so that a mirror field is produced in such a way that the center of the magnetic field exists within in the plasma generation chamber;

a pair of targets disposed within and at both ends of the plasma generation chamber perpendicular to the directions of the magnetic fluxes produced by the at least one pair of magnetic field generating means and applied with a negative potential; and the specimen chamber being connected to the plasma generation chamber in the direction perpendicular to the magnetic fluxes.

Here, the vacuum waveguide may have at least one bend portion and the microwave introduction window may be disposed at a position which cannot be directly viewed from the targets.

The plasma generation chamber and the specimen chamber may be connected to each other through a slit-like opening formed through the cylindrical wall of the plasma generation chamber, and the vacuum waveguide may have at least one bend and the microwave introduction window may be disposed at a position which cannot be directly viewed from the targets.

BRIEF DESCRIPTION OF THE DRAWINGS

FIG. 1 is a schematic sectional view showing a conventional diode sputtering apparatus;

FIG. 2 is a schematic sectional view showing a conventional triode sputtering apparatus;

FIG. 3 is a schematic sectional view showing a conventional magnetron sputtering apparatus;

BEST MODES FOR CARRYING OUT THE INVENTION

Figure 4:
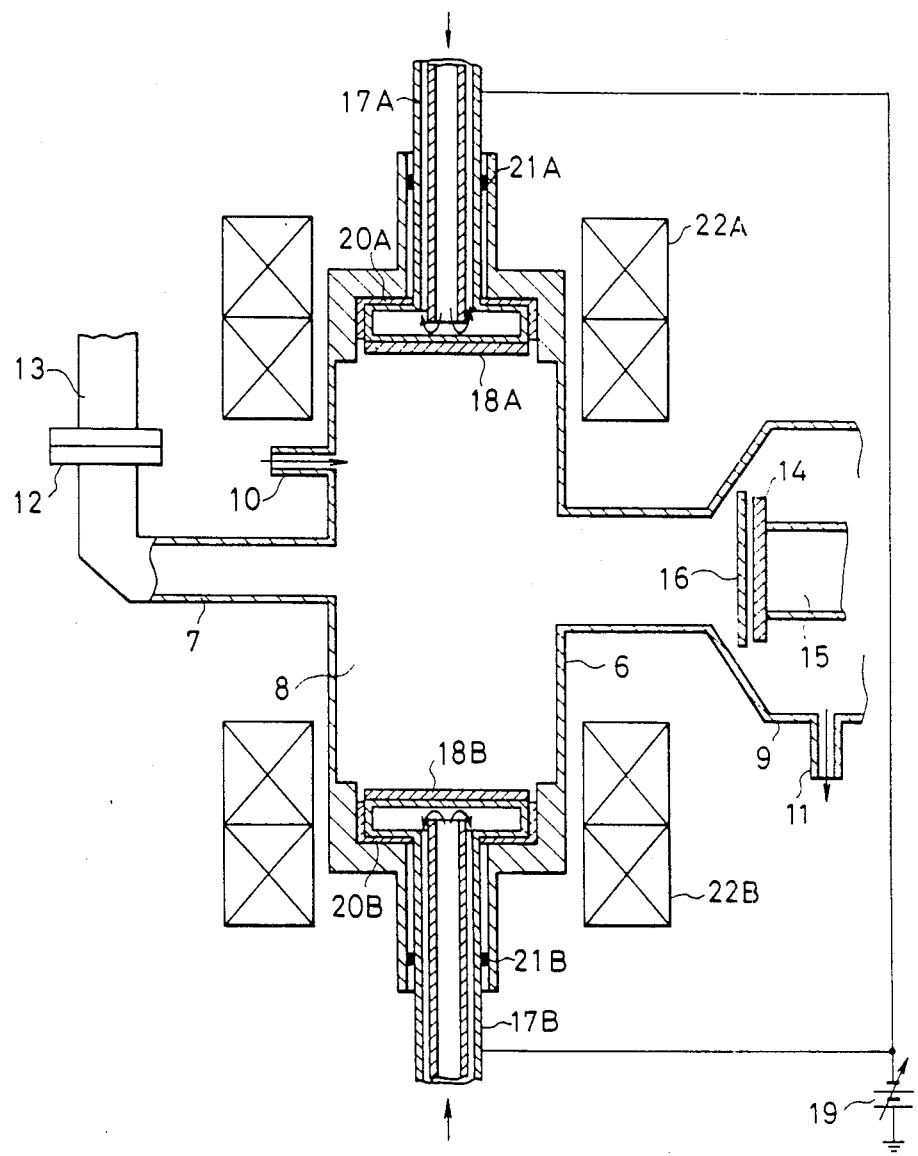
FIGS. 4 and 5 are a sectional view and a partially cutaway view in perspective, respectively, showing an embodiment of the thin film forming apparatus according to the present invention.
Figure 5:
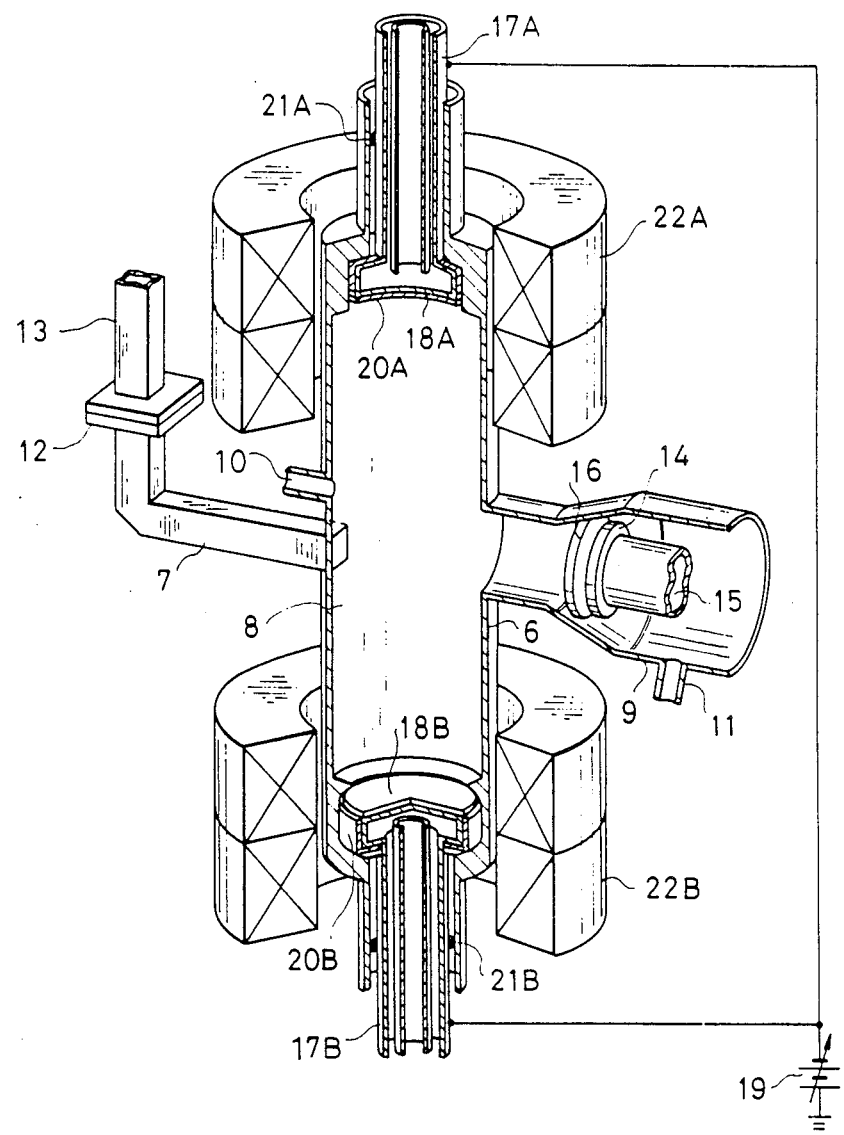

FIG. 4 is a sectional view showing a preferred embodiment of the present invention and FIG. 5 is a partially cutaway view in perspective thereof. A vacuum chamber 6 comprises a vacuum waveguide 7, a plasma generation chamber 8 and a specimen chamber 9, and has a gas inlet port 10 and a gas discharge port 11. Through a microwave introduction window 12, the vacuum chamber 6 is connected to a microwave waveguide 13, a matching means (not shown), a microwave power meter (not shown) and a microwave waveguide introduction mechanism such as an isolator (not shown) and to a microwave power supply (not shown) in the order named so that the microwave energy is fed into the vacuum chamber 6 through microwave introduction window 12. In this embodiment, the microwave introduction window 12 is a quartz glass plate and the microwave power supply is, for instance, a magnetron operating at 2.45 GHz.

The plasma generation chamber 8 is water-cooled in order to prevent the temperature rise resulting from the generation of plasma.

In the specimen chamber 9, a substrate holder 15 for supporting a substrate 14 upon which is formed a thin film is disposed. A shutter 16 which is able to be opened and closed is disposed in front of the substrate 14 in order to prevent the impingement of sputtered particles on the substrate. A heater is incorporated in the substrate holder 15 so that the substrate 14 is heated. Furthermore, DC or AC voltage can be applied to the substrate 14 and during the thin film formation process, a bias voltage can be applied to the substrate 14 and thus sputter cleaning of the substrate 14 can be accomplished.

The plasma generation chamber 8 satisfies the condition of a microwave cavity resonator, for instance, the cylindrical resonance mode $TE_{118}$. More particularly, the plasma generation chamber 8 is in the form of a cylinder of 20 cm in inner diameter and 20 cm in inner height, so that the intensity of the electric field of the microwave energy is increased, and therefore the efficiency of the microwave discharge is improved. A pair of electrically conductive target holders 17A and 17B which can be cooled by water are disposed at both ends, respectively, of the plasma generation chamber 8, and targets 18A and 18B are securely held in position to the electrically conductive target holders 17A and 17B, respectively, by soldering or by screws. The target holders 17A and 17B are electrically connected to a DC power supply 19 so that a negative voltage up to $-1.5$ kV and 10 A can be applied to the targets 18A and 18B. The target holders 17A and 17B and the inner wall of the plasma generation chamber 8 are electrically isolated from each other by insulating members 20A and 20B. Furthermore, in order to maintain a desired degree of vacuum in the plasma generation chamber 8, O-rings 21A and 21B are inserted between the inner walls of the plasma generation chamber 8 and the target holders 17A and 17B.

Electromagnets 22A and 22B are disposed around both end portions, respectively, of the plasma generation chamber 8 so that the electromagnetic field is produced in parallel with an imaginary line interconnecting the targets 18A and 18B, in other words parallel with the center axis of the plasma generation chamber 8, and therefore, the intensity of the magnetic field produced by the electromagnets 22A and 22B can be selected to establish conditions for causing electron cyclotron resonance by microwave energy inside the plasma generation chamber 8. For instance, in the case of the microwave at a frequency of 2.45 GHz, the condition for producing electron cyclotron resonance is to attain a magnetic flux density of 875 G. Accordingly, the electromagnets 22A and 22B are so designed that a maximum magnetic flux density of the order of 3000 G can be obtained. When the two electromagnets 22A and 22B are suitably spaced apart from each other the so-called mirror-field is generated. In the mirror-field arrangement the magnetic flux density becomes minimum within the plasma generation chamber 8, and energy is efficiently imparted to each electron by electron cyclotron resonance, and further the scattering of produced ions and electrons in the direction perpendicular to the magnetic field can be prevented, and the plasma can be confined with the mirror field.

Figure 6:
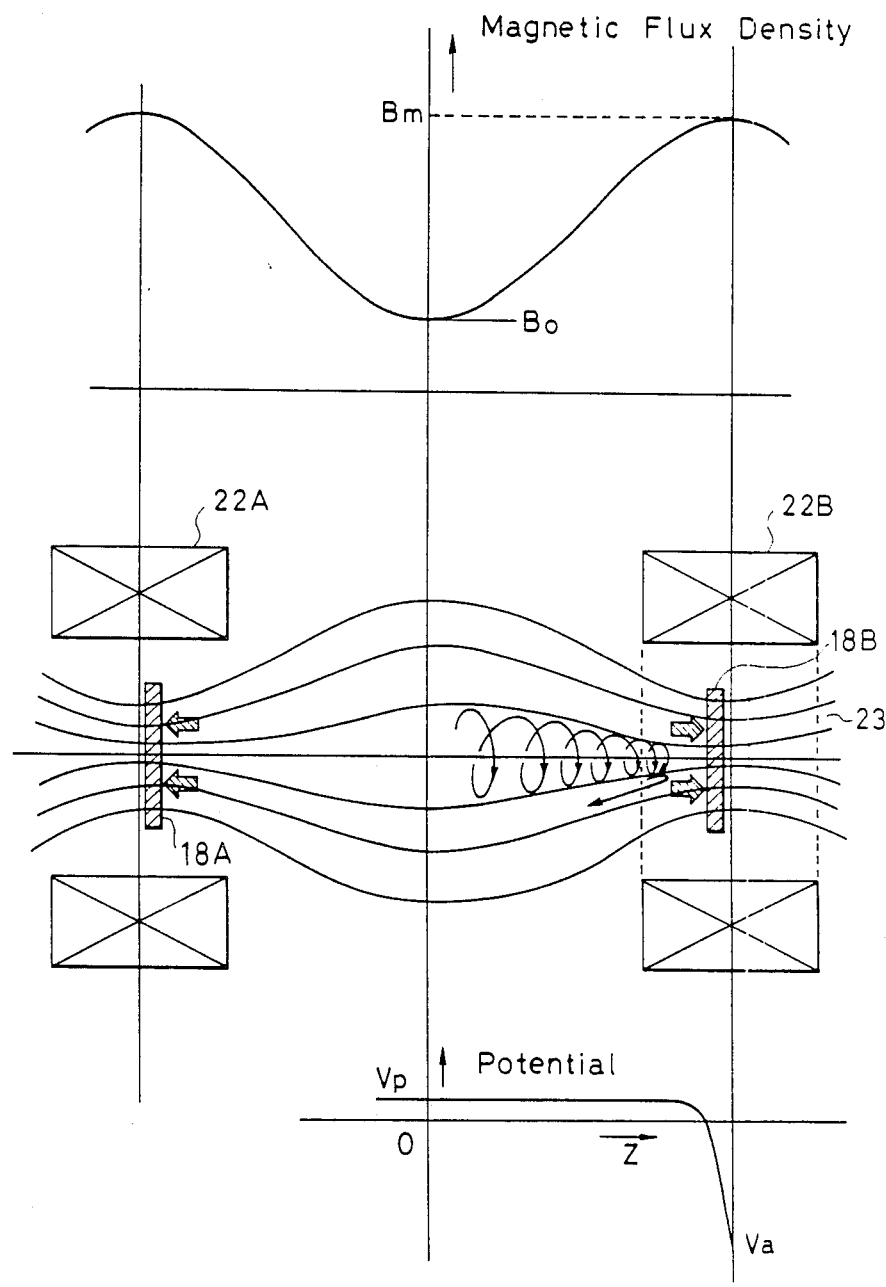
FIG. 6 is a diagram illustrating the magnetic field, the movement of charged particles, and the potential distribution in the embodiment shown in FIG. 4.

Referring next to FIG. 6, the movement of the charged particles in this embodiment will be described. The same reference numerals are used to designate similar parts in both of FIGS. 4 and 6. Here, in the case of producing plasma, the parameters are gas pressure in the plasma generation chamber, microwave power, voltage applied to the targets, gradient of the mirror field (that is the ratio between the maximum magnetic flux density of Bm at the electromagnet portions and the minimum magnetic density Bo at the center between the electromagnets 22A and 22B in the plasma generation chamber 8: Bm/Bo), and the distance between the electromagnets 22A and 22B. For instance, in the case of microwave energy at a frequency of 2.45 GHz, the minimum magnetic flux density Bo within the plasma generation chamber 8 must be maintained at a suitable level less than 875 G while the maximum magnetic flux density Bm must be varied from 1 kG to 3 kG, so that the magnetic flux density 875 G required for producing the electron cyclotron resonance at any point in the plasma generation chamber 8 can be attained. When the magnetic field is varied gradually in the space as described above, the charged particles in the plasma are confined by the lines of magnetic force 23 to make a spiral movement around the lines of the magnetic force and to be reflected at a portions having a high magnetic flux density while maintaining their angular momentum. As a result, they are forced to reciprocate in the mirror field and confined. In this case, the above-mentioned gradient Bm/Bo of the mirror field plays a very important role in confining the plasma. When a negative voltage (Va) is applied to the targets which are disclosed so as to face the high density plasma thus confined, the ions in the high density plasma are efficiently extracted toward the targets 18A and 18B, causing sputtering. In this case, the energy imparted to the targets 18A and 18B is one corresponding to the difference between the plasma potential (Vp) and the voltage (Va) applied to the targets 18A and 18B. Furthermore, a portion of particles which are sputtered from the targets 18A and 18B and which are almost neutral are ionized in the high density plasma with a high electron temperature.

Meanwhile, the electrons are confined by the magnetic field due to the mirror field and are reflected toward the center of the plasma due to the negative potential applied to the targets 18A and 18B disposed at both ends of the mirror, so that the confinement of the high-energy electrons can be realized by the effect of both the electric and magnetic fields, and therefore, the neutral gas atoms and molecules can be ionized at a higher degree of efficiency.

Furthermore, the atoms or molecules sputtered from the target material and ionized in the plasma, lose their kinetic energy in the process of reciprocal motion in the plasma and finally diffuse to the outside of the plasma by traversing the lines of magnetic force. Neutral particles also diffuse out. The ions or neutral particles thus diffused are deposited on the surface of the substrate, thus forming a thin film.

This means that the ionization in the plasma is carried out at a higher energy level (in a highly active mode) and when the ions thus ionized are extracted from the plasma to form a thin film, the ions can be extracted with an energy level less than a fraction of the ionization energy, and indicates that the sputtering apparatus with the above-mentioned magnetic field distribution has the most preferable properties when used as a thin film forming apparatus. Furthermore, since the targets and the substrate are disposed perpendicular to each other, the substrate is not subjected to the bombardment of the negative ions and the high-energy neutral particles sputtered from the targets, so that the bombardment of the substrate by various high-energy particles which presents a problem in the conventional sputtering technique can be suppressed.

When an electrically conductive thin film is formed by sputtering an electrically conductive material such as a metal, if the microwave introduction window is clouded by the adhesion of the particles sputtered from the targets, the microwave energy is reflected so that plasma cannot be maintained stably for a long period of time. In the present invention, even though the ions and neutral particles diffused out to the outside of the plasma have low energy levels, it is preferable that the microwave introduction window is spaced apart from the plasma in order to ensure stable operation. Especially as shown in FIGS. 4 and 5, it is preferable that the vacuum waveguide 7 is bent so that the microwave introduction window 12 is located at a position which cannot be viewed directly from the targets 18A and 18B; that is, a position at which the particles travelling in straight lines from the targets 18A and 18B will not adhere to the window because the particles inevitably impinge on one or more obstacles before they reach the microwave introduction window 12.

Furthermore, according to the present invention, the plasma is activated, so that it has the features that the discharge can be maintained in a stable state at lower gas pressures ($10^{-5}$ Torr) and that a thin film containing less impurities can be formed.

Furthermore, the present invention utilizes heating due to the electron cyclotron resonance, and the electron temperature in the plasma can be freely controlled. As a result, a high electron temperature sufficient to produce highly charged ions can be attained. Therefore, the present invention has an excellent feature that chemically unstable materials can be synthesized by using the highly charged ions thus produced.

In addition, according to the thin film forming apparatus of the present invention, the ionization ratio of plasma is extremely high as described above so that the sputtered neutral particles emitted from the targets are ionized at a high rate in the plasma. Furthermore, the ionized particles, which had constituted the targets, are accelerated due to the potential applied to the targets, thereby increasing the so-called self-sputtering ratio, that is, the ratio of the sputtered particles which further sputter the targets. That is, when the presence of the plasma generation gas (for instance, Ar) is extremely low or even when no gas is used, the above-mentioned self-sputtering process continues, so that the present invention has a further feature that it becomes possible to form a thin film having a high degree of purity.

Next, the results of the formation of $Al_2O_3$ films by utilizing the apparatus of the present invention will be described. Metallic aluminum (Al) was used as targets and the specimen chamber 9 was evacuated at $5 \times 10^{-7}$ Torr. Thereafter, argon gas and oxygen gas (the partial pressure ratio was 1:1) were introduced until the gas pressure in the plasma generation chamber rose to $3 \times 10^{-4}$ Torr. Next, a thin film was formed under the conditions that the microwave power was controlled between 100 and 800 W; the voltage applied to the targets was varied between $-300$ and $-1$ kV; and the gradient of the mirror field was maintained at 2 kG/700 G. Under these conditions, the magnetic flux density 875 G required for causing the resonance was attained in the center portion of the plasma generation chamber. The length of this portion in the direction of targets is 3 cm. The sputtering process was started while the specimen holder was not heated. The deposition rate was increased with increase of the microwave power and the voltage applied to the targets. For instance, when the microwave power was 500 W and the voltage applied to the targets was $-500$ V, the deposition rate was 800 Å/min. When the microwave power and the voltage applied to the targets were varied in the abovementioned ranges, thin films were formed efficiently at deposition rates from 100 to 1000 Å/min. As compared with the thin films formed by the conventional sputtering processes, the internal stresses in the films were low, so that films 2 μm or more in thickness were formed in a stable manner without causing cracks and exfoliation. In these cases, the temperatures of the substrates was about 200° C. and it was possible to form a thin film over a polymer film at a high deposition rate.

In this case, the average energy of the ions varied from 5 eV to 25 eV, and 10 to 30% of the particles which travelled toward the substrates were ions.

The thin film forming apparatus in accordance with the present invention can be used to form not only $Al_2O_3$ but also other various thin films.

Figure 7:
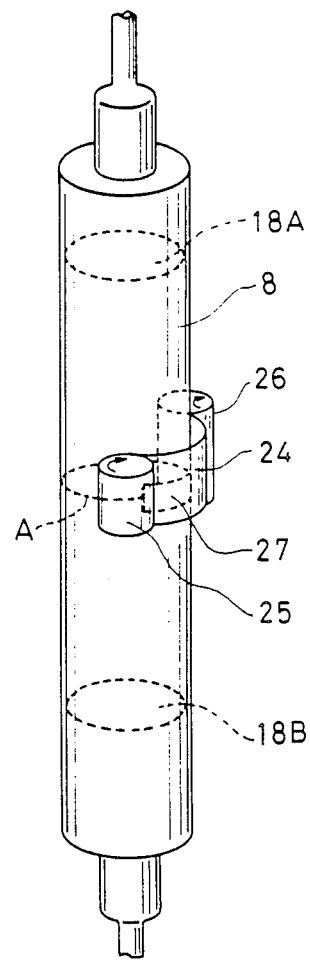
FIG. 7 is a partial perspective view showing a further embodiment of the thin film forming apparatus according to the present invention.

FIG. 7 is a partial view of a further embodiment of a thin film forming apparatus in accordance with the present invention. This embodiment is especially adapted for continuously forming a thin film over the surface of a tape-like substrate. In FIG. 7 the positional relationship among the plasma generation chamber 8, the targets 18A and 18B and a tape-like substrate 24 are shown. The microwave introduction mechanism and the generation of a mirror magnetic field are substantially similar to those described above with reference to FIG. 4 showing the first embodiment of the present invention. The tape-like substrate 24 is fed from a feed bobbin 25 and then taken up by a take-up bobbin 26. Both the feed and take-up bobbins 25 and 26 are disposed within the specimen chamber 9 and are driven by a driving system including, for instance, a motor (not shown). At a substantially intermediate portion between the targets 18A and 18B a slit-like opening 27 is formed through the cylindrical wall of the plasma generation chamber 8.

Within the plasma generation chamber 8, the mode of plasma generation is uniformly around the circumference of a circle indicated by the broken line A which is in parallel with the targets 18A and 18B. It follows therefore that when the tape-like substrate 24 is arranged along the circumference of the circle A, a thin film is formed under the same conditions. Therefore, the slit-like opening 27 of 10 mm in width and ⅓ of the circumference in length is formed through the wall of the cylindrical wall of the plasma generation chamber 8 at a position corresponding to the midpoint between the opposing targets 18A and 18B. This slit-like opening 27 leads to specimen chamber 9. In the specimen chamber, the feed bobbin 25 and the take-up bobbin 26 are arranged in such a way that the tape-like substrate 24 is transported along this slit-like opening 27. Under these conditions, the tape-like substrate 24 was transported and a thin metal film was formed on the surface of the moving tape-like substrate 24. The targets were composed of various metals such as aluminum, copper and so on. After the specimen chamber 9 was evacuated at $5 \times 10^{-7}$ Torr, Ar gas was introduced until the gas pressure in the plasma generation chamber 8 became $3 \times 10^{-4}$ Torr. A thin film was formed under the conditions that the microwave power was 100–800 W; the voltage applied to the targets was between −300 and −1 kV and the gradient of the mirror field was maintained at 2 kG/700 G. Thus, metal films uniform in thickness were formed across the width of 12 mm of the tape-like substrate 21.

In both embodiments described above, the magnetic coils are used to generate a mirror field, but it is apparent to those skilled in the art that a mirror field can be produced by using various permanent magnets or any suitable combination thereof. Furthermore, it is also apparent that the gradient of a mirror field can be made asymmetrical.

INDUSTRIAL APPLICABILITY

As described above, according to the present invention, plasma is produced by the discharge of a microwave energy with the condition of electron cyclotron resonance and it is confined by a mirror field at a high degree of efficiency. The targets are so disposed that the magnetic flux of the mirror field is perpendicular to the target. Therefore, the ions in the high density plasma can be extracted toward the targets at a high degree of efficiency, thereby carrying out the sputtering process. According to the apparatus of the present invention, highly activated plasma can be produced at a low gas pressure. As compared with the conventional sputtering apparatus, a thin film can be formed at a low gas pressure at a high deposition rate by the particles having an extremely high ionization ratio. Furthermore, the energy of the particles can be controlled freely in a wide range between a few electron volts and hundreds of electron volts (eV) and the dispersion of the energy is reduced to a minimum. With the thin-film forming apparatus in accordance with the present invention, not only does it become possible to form a high quality film having a high degree of purity and much less damage at a high deposition rate under a condition of low substrate temperature and a higher degree of efficiency, but it also becomes possible to form a thin film of a nonequilibrium material at a low temperature and in a highly stable manner which has not been hitherto obtained by the conventional apparatus.

Furthermore, in the thin film forming apparatus in accordance with the present invention, there exists an equivalent position along the circumference of the cylindrical plasma generation chamber, so that when a slit-like opening can be formed along this position, it becomes possible to continuously form a thin film on the surface of a tape-like substrate.

We claim:

1. A thin film forming apparatus comprising:
   a vacuum chamber consisting of a vacuum waveguide having a microwave introduction window at one end thereof, said microwave introduction window being connected to a microwave waveguide, a plasma generation chamber having a diameter and a length sufficient to define a microwave cavity resonator for causing resonance of the introduced microwave energy, and a specimen chamber adapted to contain a specimen substrate to be coated with a thin film, all connected with each other in the order named, and further having a gas introduction inlet;
   at least one pair of magnetic field generating means which are disposed around the outer side of both the end portions of said plasma generation chamber so that a mirror field is produced in such a way that the center of the magnetic field exists within said plasma generation chamber;
   a pair of targets disposed within and at both ends of said plasma generation chamber perpendicular to the directions of the magnetic fluxes produced by said at least one pair of magnetic field generating means and adapted to be applied with a negative potential; and
   said specimen chamber being connected to said plasma generation chamber in the direction perpendicular to said magnetic fluxes, whereby said specimen substrate is not subjected to bombardment by high energy particles.

2. A thin film forming apparatus as claimed in claim 1, wherein said vacuum waveguide has at least one bend portion and said microwave introduction window is disposed at a position which cannot be directly viewed from said targets.

3. A thin film forming apparatus as claimed in claim 1, wherein said plasma generation chamber and said specimen chamber are connected to each other through a slit-like opening formed through the cylindrical wall of said plasma generation chamber.

4. A thin film forming apparatus as claimed in claim 3, wherein said vacuum waveguide has at least one bend portion and said microwave introduction window is disposed at a position which cannot be directly viewed from said targets.

* * * * *